United States Patent [19]

Ohta et al.

[11] Patent Number: 4,883,718

[45] Date of Patent: Nov. 28, 1989

[54] FLEXIBLE COPPER-CLAD CIRCUIT SUBSTRATE

[75] Inventors: Masahiro Ohta, Yokohama; Saburo Kawashima, Yokosuka; Yoshiho Snobe, Yokohama; Shoji Tamai, Yokohama; Hideaki Oikawa, Yokohama; Akihiro Yamaguchi, Kamakura, all of Japan

[73] Assignee: Mitsui Toatsu Chemicals, Inc., Tokyo, Japan

[21] Appl. No.: 159,850

[22] PCT Filed: Jun. 30, 1986

[86] PCT No.: PCT/JP86/00334

§ 371 Date: Feb. 5, 1988

§ 102(e) Date: Feb. 5, 1988

[87] PCT Pub. No.: WO88/00428

PCT Pub. Date: Jan. 14, 1988

Related U.S. Application Data

[63] Continuation-in-part of Ser. No. 44,028, Jun. 13, 1986, Pat. No. 4,847,349.

[30] Foreign Application Priority Data

Feb. 12, 1985 [JP] Japan .................................. 60-23520

[51] Int. Cl.[4] ........................ B32B 15/08; B32B 27/06
[52] U.S. Cl. .................................. 428/458; 428/473.5; 428/901; 528/125; 528/176; 528/185; 564/430
[58] Field of Search ...................... 428/458, 473.5, 901; 528/125, 185, 176; 564/130

[56] References Cited

U.S. PATENT DOCUMENTS

| | | | |
|---|---|---|---|
| 4,065,345 | 12/1977 | Progar et al. ..................... | 156/307.5 |
| 4,196,144 | 4/1980 | Darms .................................. | 564/430 |
| 4,477,648 | 10/1984 | Jones et al. ......................... | 528/185 |
| 4,696,994 | 9/1987 | Nakajima et al. .................. | 528/176 |

FOREIGN PATENT DOCUMENTS

| | | | |
|---|---|---|---|
| 52-35281 | 3/1977 | Japan ............................. | 428/901 X |
| 58-155790 | 9/1983 | Japan .................................. | 428/458 |
| 58-157190 | 9/1983 | Japan .................................. | 528/185 |
| 58-190092 | 11/1983 | Japan .................................. | 428/458 |
| 59-76451 | 5/1984 | Japan .................................. | 528/185 |
| 59-168030 | 9/1984 | Japan .................................. | 528/185 |
| 60-243120 | 12/1985 | Japan .................................. | 428/901 |
| 60-258228 | 12/1985 | Japan .................................. | 428/473.5 |
| 143478 | 7/1986 | Japan .................................. | 528/185 |

OTHER PUBLICATIONS

Yasuo et al., English Translation of Japanese Patent No. 58-157190, Sep. 19, 1983.
Shunichi et al., English Translation of Japanese Patent No. 59-76451, May 1, 1984.
Susumu, English Translation of Japanese Patent No. 59-168030, Sep. 21, 1984.
English Translation of Japanese Patent No. 52-35281; 3/1977, claim.
English Translation of Japanese Patent No. 58-190092, 11/1983, claim.
English Translation of Japanese Patent No. 58-155790, 9/1983.
English Translation of Japanese Patent No. 60-243120, 12/1985, claims 1-5.
English Translation of Japanese Patent No. 60-258228, 12-1985.
Bell, Journal of Polymer Science: Polym. Chem. Ed., 14, 225-235, 2275-2292 (1976).

*Primary Examiner*—Thomas J. Herbert
*Attorney, Agent, or Firm*—Fisher, Christen & Sabol

[57] ABSTRACT

This invention relates to flexible copper-clad circuit substrates where copper foil is directly and firmly jointed with a polyimide film.

Polyimide used is obtained conventionally by reacting diamine components including 3,3'-diaminobenzophenone, 1,3-bis(3-aminophenoxy)-bezene, 4,4'-bis(3-aminophenoxy)biphenyl, 2,2-bis[4-(3-aminophenoxy)phenyl]propane, 2,2-bis[4-(3-aminophenoxy)phenyl]-1,1,1,3,3,3-hexafluoropropane, bis[4-(3-aminophenoxy)phenyl] sulfide, bis[4-(3-aminophenoxy)phenyl] ketone and bis[4-(3-aminophenoxy)phenyl] sulfone, with tetracarboxylic acid dianhydride including pyromellitic dianhydride, 3,3',4,4'-benzophenone tetracarboxylic dianhydride, 3,3',4,4'-biphenyl tetracarboxylic dianhydride and bis(3,4-dicarboxyphenyl) ether dianhydride, in organic solvent, and by thermally or chemically imidizing resultant polyamic acid.

Polyimide thus obtained has relatively lower melt viscosity and is flowable at high temperatures. Therefore, the copper foil and the polyimide film were assembled, pressed by heating under pressure and further cured to afford the flexible copper-clad circuit substrates having the polyimide film firmly jointed with the copper foil.

3 Claims, No Drawings

FLEXIBLE COPPER-CLAD CIRCUIT SUBSTRATE

This is a continuation-in-part of U.S. application Ser. No. 044,028, filed on June 30, 1986 now U.S. Pat. No. 4,847,349.

FIELD OF THE INVENTION

The present invention relates to flexible copper-clad circuit substrates and particularly related to the flexible copper-clad circuit substrates which are excellent in high-temperature stability and high-temperature adhesion.

BACKGROUND OF THE INVENTION

The flexible copper-clad circuit substrates which are used for printed circuit substrates of electronic instruments recently have a serious problem of increase in heat generation accompanied by rise up of package density and wiring pattern density. Thus an important subject is to improve high-temperature stability of the substrates. High-temperature resin which substitutes conventional epoxy resin, includes heat-stable epoxy, polyamide imide, polybenzimidazole, silicone, and polyimide resin. These resins, however, are not always satisfactory to the peel strength to copper foil. Among these resins, polyimide in particular is excellent in high-temperature stability and electrical characteristics, and has increasingly been interested as the materials for electrical insulation. Polyimide, however, has poor bonding strength to metals and requires adhesives to bond the copper foil when polyimide is used for the base film of copper-clad circuit substrates. In spite of good high-temperature stability, insufficient thermal stability of the adhesives inhibits the full utilization of essential high-temperature stability of polyimide. Therefore, polyimide is extensively required which is excellent in high-temperature stability and adhesive strength to metals.

The object of this invention is to provide the high-temperature stable and flexible copper-clad circuit substrates which cause no reduction of adhesive strength during and after use at high temperatures and require no adhesives.

DETAILED DESCRIPTION OF THE INVENTION

The inventors studied hard to solve these problems and achieved the invention by finding the fact that polyimide prepared from particular diamine and tetracarboxylic acid dianhydride was flowable at high temperatures as well as excellent in high temperature stability and bonding strength to the copper foil.

High temperature flowable polyimide in this invention means polyimide which has melt viscosity of $5 \times 10^5$ poises and less at 400° C. and shear rate of $10^3$ l/second by the flow tester of the Society of Polymer Science model (Shimadzu Seisakusho CFT-500) with a nozzle of 0.1 cm in diameter and 1 cm in length. Polyimide in this category is prepared from the following diamine and tetracarboxylic acid dianhydride.

Polyimide and/or its polyamic acid precursor for use in this invention are not restricted in particular on the method of their preparation. They can normally be prepared by polymerizing various diamine with tetracarboxylic acid dianhydride in organic solvents.

Diamine for use in this method includes 3,3'-diaminobenzophenone, 1,3-bis(3-aminophenoxy)benzene, 4,4'-bis(3-aminophenoxy)-biphenyl, 2,2-bis[4-(3-aminophenoxy)phenyl]propane, 2,2-bis[4-(3-aminophenoxy)phenyl]-1,1,1,3,3,3-hexfluoropropane, bis[4-(3aminophenoxy)-phenyl]sulfide, bis[4-(3-aminophenoxy)phenyl]ketone and bis[4-(3-amino-phenoxy)phenyl]sulfone. These are used singly or in mixtures of the two or more.

Tetracarboxylic acid dianhydride to be reacted with diamine has the following formula(I):

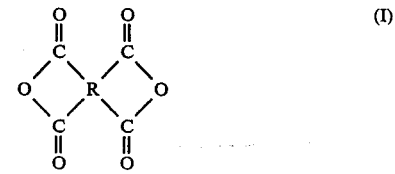

(where R is a tetra-valent radical selected from the group consisting of aliphatic radical having 2 and more carbons, cycloaliphatic radical, monoaromatic radical, condensed polyaromatic radical, and non condensed polyaromatic radical wherein aromatic radicals are mutually connected with a bond or a crosslinking function).

The dianhydride includes, for example, ethylene tetracarboxylic dianhydride, cyclopentane tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2'3,3'-biphenyl tetracarboxylic dianhydride, 2,2-bis(3,4-dicarboxyphenyl)-propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 1,2,3,4-benzene tetracarboxylic dianhydride, 3,4,9,10-perilene tetracarboxylic dianhydride, 2,3,6,7-anthracene tetracarboxylic dianhydride and 1,2,7,8-phenanthrene tetracarboxylic dianhydride. These are used singly or in mixtures of two or more.

Particularly preferred tetracarboxylic acid dianhydride is pyromellitic dianhydride, 3,3',4,4'-benzophenone tetracarboxylic dianhydride, 3,3',4,4'-biphenyl tetracarboxylic dianhydride and bis(3,4-dicarboxyphenyl)ether dianhydride.

Polyamic acid precursor of polyimide is normally prepared in the organic solvents.

Organic solvents include, for example, N-methyl-2-pyrrolidone, N,N-dimethylacetamide, N,N-dimethylformamide, 1,3-dimethyl-2-imidazolidinone, N,N-diethylacetamide, N,N-dimethyl-methoxyacetamide, dimethyl sulfoxide, pyridine, dimethyl sulfone, hexamethylphosphoramide, tetramethylurea, N-methylcaprolactam, tetrahydrofuran, m-dioxane, p-dioxane, 1,2-dimethoxyethane, bis(2-methoxyethyl)ether, 1,2-bis(2-methoxyethoxy)ethane and bis[2-(2-methoxyethoxy)ethyl]ether. These solvents are used singly or in mixtures of two or more.

Reaction temperature is normally 200° C. or less and preferably 50° C. and less. Reaction pressure is not restricted in particular and the reaction can satisfactorily conducted at atmospheric pressure.

Reaction time depends upon type of solvents, reaction temperature, diamine and acid dianhydride applied and is normally carried out enough to complete the formation of polyamic acid. Normally 4-24 hours is sufficient.

Corresponding polyimide can be obtained from polyamic acid by imidizing thermally at 100°-400° C. or by use of dehydrating agent such as acetic anhydride.

For example, bis[4-(3-aminophenoxy)phenyl]sulfide is reacted in the organic solvent with tetracarboxylic acid dianhydride having the formula (I):

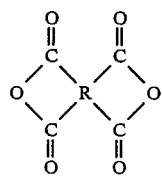   (I)

(where R is the same as above) to give polyamic acid having recurring units of the formula (II):

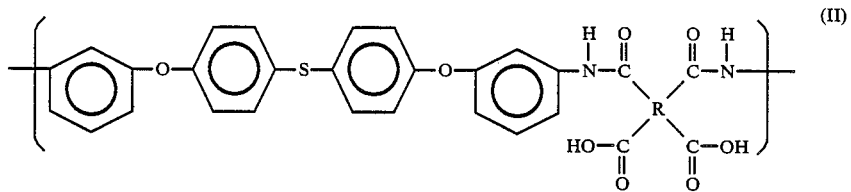   (II)

(where R is the same as above).

Polyamic acid thus obtained is imidized to give polyimide having recurring units of the formula (III):

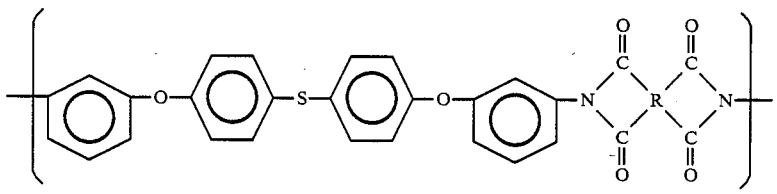   (III)

(where R is the same as above).

In the present invention, following polyimide is preferably used in particular.

(1) Polyimide which is derived from 3,3'-diaminobenzophenone and tetracarboxylic acid dianhydride having the formula (I):

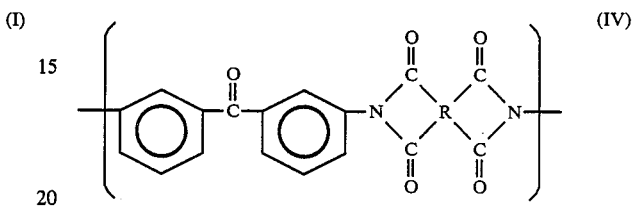   (I)

(where R is the same as above) and which has recurring units of the formula (IV):

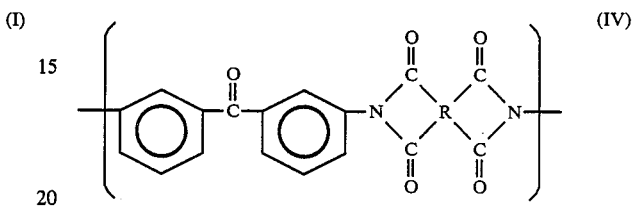   (IV)

(where R is the same as above).

(2) Polyimide which is derived from 4,4'-bis(3-aminophenoxy)biphenyl and tetracarboxylic acid dianhydride having the formula (I):

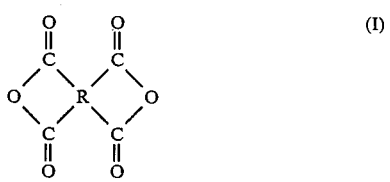   (I)

(where R is the same as above) and which has recurring units of the formula (V):

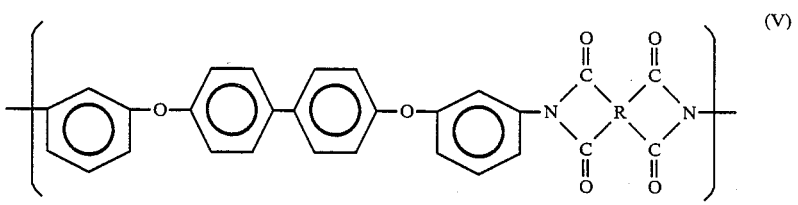   (V)

(where R is the same as above).

(3) Polyimide which is derived from 2,2-bis[4-(3-aminophenoxy)phenyl]propane and tetracarboxylic acid dianhydride having the formula (I):

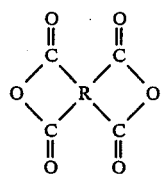
(I)

(where R is the same as above) and which has recurring units of the formula (VI):

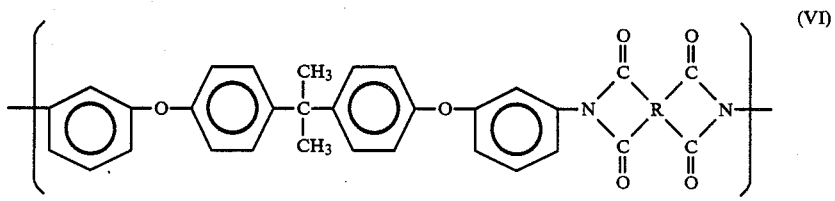
(VI)

(where R is the same as above).

(4) Polyimide which is derived from 2,2-bis[4-(3-aminophenoxy)-phenyl]-1,1,1,3,3,3-hexafluoropropane and tetracarboxylic acid dianhydride having the formula (I):

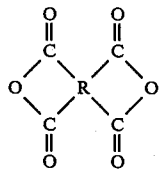
(I)

(where R is the same as above) and which has recurring units of the formula (VII):

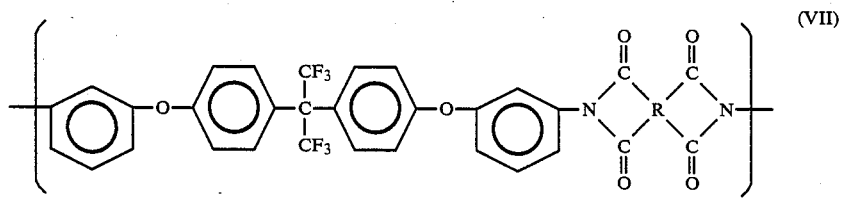
(VII)

(where R is the same as above).

(5) Polyimide which is derived from bis[4-(3-aminophenoxy)phenyl]ketone and tetracarboxylic acid dianhydride having the formula (I):

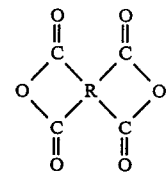
(I)

(where R is the same as above) and which has recurring units of the formula (VIII):

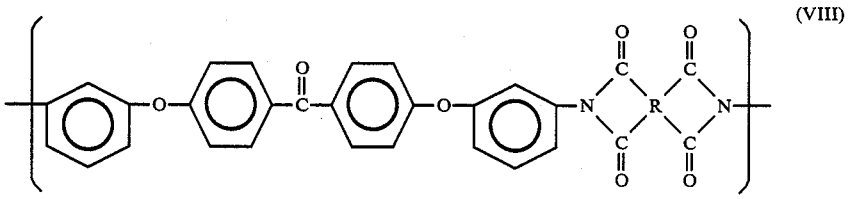
(VIII)

(where R is the same as above).

(6) Polyimide wich is derived from bis[4-(3-aminophenoxy)phenyl]sulfide and tetracarboxylic acid dianhydride having the formula (I):

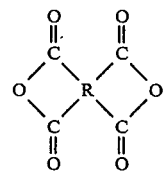
(I)

(where R is the same as above) and which has recurring units of the formula (IX):

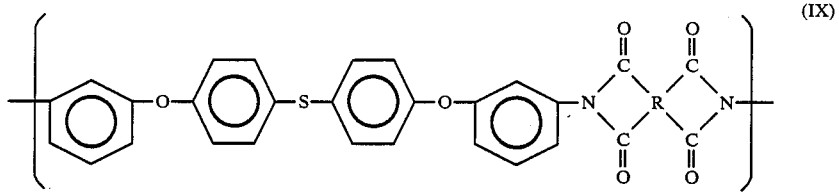

(where R is the same as above).

(7) Polyimide which is derived from bis[4-(3-aminophenoxy)phenyl]sulfone and tetracarboxylic acid dianhydride having the formula (I):

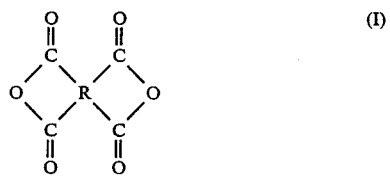

(where R is the same as above) and which has recurring units of the formula (X):

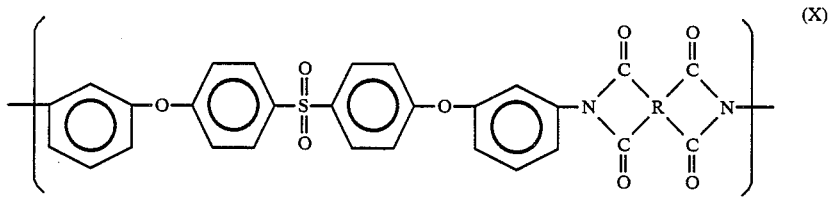

(where R is the same as above).

(8) Polyimide which is derived from 1,3-bis(3-aminophenoxy)benzene and tetracarboxylic acid dianhydride having the formula (I):

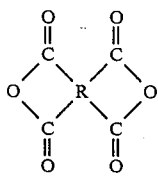

(where R is the same as above) and which has recurring units of the formula (XI):

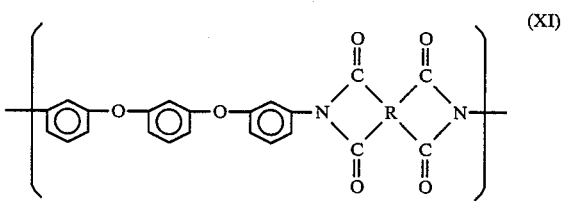

(where R is the same as above).

The adhesion between high temperature flowable polyimide of this inventin and the copper foil is performed by use of (1) polyimide or (2) polyamic acid precursor of polyimide.

(1) When polyimide is used, polyamic acid is thermally or chemically dehydrated in advance to obtain polyimide in the form of film or powder. Polyimide film can also be made by calender rolling the powder. The film or powder is put on the copper foil, pressed at 50°–400° C. under pressure of 1–1,000 kg/cm² and cured at 100°–400° C. to give the flexible copper-clad circuit substrates.

(2) When polyamic acid precursor of polyimide is used, the polyamic acid solution is applied on the copper foil and heated at 100°–400° C., preferably at 200°–300° C. to remove the solvents and convert polyamic acid to more stable polyimide.

The polyamic acid solution is required to have optimum viscosity so that desired thickness of the coated film can be obtained by given application methods. Preferred viscosity is 1,000–300,000 centipoises and concentration can also be adjusted by the organic solvents used. Coating should be made as uniform as possible and can be performed with bar coaters or doctor blades.

Besides, in the thermal conversion of polyamic acid to polyimide, also preferred is heating under pressure of 1–1,000 kg/cm², preferably 1–50 kg/cm². Peel strength of the copper foil with polymer film can be further reinforced by increasing the pressure.

In addition, the polyimide layer of flexible copper-clad circuit substrates in this invention is flowable at high temperatures, and thus these substrates are also characterized by the ability of hot-bonding with other metal substrates.

SPECIFIC EXAMPLES

The invention will be illustrated further with respect to the following examples. Inherent viscosity in these Examples was measured at 35° C. in 0.5 g/100 ml N,N-dimethylacetamide solution. Rotational viscosity was measured at 25° C. with a high viscosity rotor of model B viscometer.

Melt viscosity was measured at various temperatures and pressures with an nozzle of 0.1 cm in diameter and 1 cm in length, by use of the Society of Polymer Science Model flow tester (Shimadzu Seisakusho CFT-500).

In addition, peel strength of the copper foil on the copper-clad circuit substrates was measured in accordance with JIS C-6481.

EXAMPLE 1

In a reaction vessel with a stirrer, reflux condenser and nitrogen inlet tube, 53.0 grams (0.25 mol) of 3,3'-diaminobenzophenone was dissolved into 240 ml of N,N-dimethylacetamide. The resultant solution was added with 78.6 grams (0.244 mol) of 3,3',4,4'-benzophenone tetracarboxylic dianhydride powder and stirred at 10° C. for 24 hours. The polyamic acid thus obtained had inherent viscosity of 0.59 dl/g and rotational viscosity of 32,000 cps. The solution was uniformly coated with the doctor blade on the electrolytic copper foil having 35 μm in thickness.

The coated copper foil was heated for an hour each at 100° C., 200° C. and 300° C. to give the copper-clad circuit substrates. Thickness of the coated film was about 50 μm. Peel strength of the copper foil of the copper-clad circuit substrates was 3.5 kg/cm at the room temperature (25° C.). The same value was obtained by the solder heat resistance test for 180 seconds at 180° C. or 300° C.

In addition, a part of the polyamic acid solution was heated at 100° C. to give polyimide powder having melt viscosity of 2,900 poises at 330° C. and shear rate of $10^3$ 1/second.

EXAMPLE 2

The electrolytic copper foil having 35 μm in thickness was put on a steel drum for continuous film casting and the polyamic acid solution obtained in Example 1 was continuously casted with the doctor blade. The steel drum was gradually heated from 100° C. to 250° C. and finally the foil was pressed through rolls at 300° C. to give the copper-clad circuit substrates continuously. Thickness of the coated film was about 55 μm. Peel strength of the copper foil of the substrates was 3.7 kg/cm at the room temperature (25° C.). The same value was obtained by the solder heat resistance test for 180 seconds at 260° C. or 300° C.

EXAMPLE 3

A reaction vessel with a stirrer, reflux condenser and nitrogen inlet tube was charged with 41.0 grams (0.1 mol) of 2,2-bis[4-(3aminophenoxy)phenyl]propane and 200 ml of N,N-dimethylacetamide and cooled to about 0° C. Under nitrogen atmosphere 21.8 grams (0.1 mol) of pyromellitic dianhydride powder were added and stirred for 2 hours at about 0° C. The temperature of the reaction mixture was raised to the room temperature and stirred for about 20 hours under nitrogen atmosphere. The polyamic acid solution thus obtained had inherent viscosity of 1.5 dl/g and rotational viscosity of 56,000 cps.

The solution was applied on the electrolytic copper foil having 35 μm in thickness. The coated copper foil was heated for an hour each at 100° C., 200° C. and 300° C. to give the copper-clad circuit substrate. Thickness of the coated film was 125 μm. Peel strength of the copper foil was 3.8 kg/cm at the room temperature (25° C.). The same value was obtained by the solder heat resistance test for 180 seconds at 180° C. or 300° C.

Besides the polyimide powder obtained by the same procedure as Example 1 had melt viscosity of 4,900 poises at 380° C. and shear rate of $10^3$ 1/second.

EXAMPLE 4

A reaction vessel with a stirrer, reflux condenser and nitrogen inlet tube was charged with 41.0 grams (0.1 mol) of 2,2-bis[4-(3-aminophenoxy)phenyl]propane and 219.6 grams of N,N-dimethylacetamide. Under nitrogen atmosphere and at the room temperature, 31.6 grams (0.098 mol) of 3,3',4,4'-benzophenone tetracarboxylic dianhydride was added as dry solids by small portions with care to avoid temperature rise of the solution and reacted for 23 hours at the room temperature. The resultant polyamide acid had inherent viscosity of 0.70 dl/g.

The polyamid acid solution was diluted with 266 grams of N,N-dimethylacetamide to give rotational viscosity of 35,600 cps.

The solution thus obtained was applied on the electrolytic copper foil as Example 1 to give the copper-clad circuit substrates having film thickness of 35 μm. The peel strength of the copper foil was 3.6 kg/cm at the room temperature (25° C.). The same value was obtained by the solder heat resistance test for 180 seconds at 260° C. or 300° C.

COMPARATIVE EXAMPLE 1

The procedure of Example 4 was repeated except 2,2-bis-[4-(4-aminophenoxy)phenyl]propane was used in place of 2,2-bis-[4-(3-aminophenoxy)phenyl]propane to give polyamic acid having inherent viscosity of 1.16 dl/g.

The polyimide powder prepared from the polyamic acid did not flow even at 400° C. under load of 500 kg.

The polyamic acid solution was diluted with 368 grams of N,N-dimethylacetamide to give rotational viscosity of 34,200 cps. The copper-clad circuit substrates having film thickness of 34 μm were obtained by the same procedure as Example 1. Peel strength of the copper-foil was an inferior value of 0.7 kg/cm at the room temperature (25° C.).

EXAMPLE 5–21 AND COMPARATIVE EXAMPLE 2

The procedure of Example 1 was repeated except type and quantity of diamine, quantity of N,N-dimethylacetamide, and type and quantity of tetracarboxylic acid dianhydride were changed to give results described in Table 1 and 2.

Regarding the quantity of N,N-dimethylacetamide in Table 1, normal figures indicate the quantity used for polymerization and those in parentheses indicate the quantity further added after polymerization to dilute the solution. When diluted, rotational viscosity was measured after dilution. Melt viscosity was measured at shear rate of $10^3$ 1/second.

In the Table 1, PMDA means pyromellitic dianhydride, BTDA means 3,3',4,4'-benzophenone tetracarboxylic dianhydride, ODPA means bis(3,4-dicarboxyphenyl)ether dianhydride and BPDA means 3,3',4,4'-biphenyl tetracarboxylic dianhydride.

EXAMPLE 22

The polyamic acid varnish obtained in Example 5 was casted on the glass plate and heated for an hour each at 100° C., 200° C. and 300° C. to give a light yellow and transparent polyimide film having thickness of 30 μm. The polyimide film had tensile strength of 13.5 kg/mm² and elongation of 42% in accordance with ASTM D-882. The film also had glass transition temperature of 225° C. in accordance with TMA penetration method and the 5% by weight decrease temperature in air of 542° C. in accordance with DTA-TG method.

The polyimide film was put on the electrolytic copper foil having 35 μm in thickness and was hot-pressed at 270° C. for 10 minutes under pressure of 20 kg/cm² to give flexible copper-clad circuit substrates. Peel strength of the copper foil was 2.7 kg/cm at the room temperature (25° C.). The same value was obtained by the solder heat resistance test for 180 seconds at 260° C. or 300° C.

TABLE 1

Materials and Solvent

| No. | Diamine (g) | (mol) | Dianhydride (g) (mol) | Solvent (N,N—Dimethylacetamide) (g) |
|---|---|---|---|---|
| Example - 5 | bis[4-(3-aminophenoxy)phenyl] sulfide 40 | (0.1) | PMDA 21.1 (0.097) | 184.5 |
| Example - 6 | bis[4-(3-aminophenoxy)phenyl] sulfide 40 | (0.1) | BTDA 31.6 (0.098) | 214.8 |
| Example - 7 | bis[4-(3-aminophenoxy)phenyl] sulfide 40 | (0.1) | ODPA 36.6 (0.0986) | 184.5 |
| Example - 8 | bis[4-(3-aminophenoxy)phenyl] sulfide 40 | (0.1) | BPDA 28.3 (0.0965) | 205 |
| Example - 9 | 4,4'-bis(3-aminophenoxy)biphenyl 36.8 | (0.1) | PMDA 20.71 (0.095) | 175.8 |
| Example - 10 | 4,4'-bis(3-aminophenoxy)biphenyl 18.4 | (0.05) | BTDA 16.1 (0.05) | 103.5 (473) |
| Example - 11 | 4,4'-bis(3-aminophenoxy)biphenyl 9.2 | (0.025) | ODPA 7.75 (0.025) | 50.85 (271) |
| Example - 12 | 4,4'-bis(3-aminophenoxy)biphenyl 9.2 | (0.025) | BPDA 7.06 (0.024) | 48.8 (206) |
| Example - 13 | bis[4-(3-aminophenoxy)phenyl] ketone 39.6 | (0.1) | PMDA 21.36 (0.098) | 182.9 |
| Example - 14 | bis[4-(3-aminophenoxy)phenyl] ketone 39.6 | (0.1) | PMDA 21.36 (0.098) | 182.9 |
| Example - 15 | bis[4-(3-aminophenoxy)phenyl] ketone 39.6 | (0.1) | BTDA 31.5 (0.098) | 215.4 |
| Example - 16 | bis[4-(3-aminophenoxy)phenyl] ketone 39.6 | (0.1) | ODPA 30.5 (0.099) | 210 |
| Example - 17 | bis[4-(3-aminophenoxy)phenyl] sulfone 43.2 | (0.1) | PMDA 21.8 (0.1) | 195 (823) |
| Example - 18 | bis[4-(3-aminophenoxy)phenyl] sulfone 43.2 | (0.1) | BPDA 28.4 (0.0965) | 167 |
| Example - 19 | 2,2-bis[4-(3-aminophenoxy)phenyl]-1,1,1,3,3,3-hexafluoropropane 10.36 | (0.02) | PMDA 4.273 (0.0196) | 44.16 |
| Example - 20 | 2,2-bis[4-(3-aminophenoxy)phenyl]-1,1,1,3,3,3-hexafluoropropane 5.18 | (0.01) | BTDA 3.19 (0.0099) | 25.2 (8.3) |
| Example - 21 | 2,2-bis[4-(3-aminophenoxy)phenyl]-1,1,1,3,3,3-hexafluoropropane 5.18 | (0.01) | ODPA 3.01 (0.0097) | 24.6 |
| Comparat. Example - 2 | 4,4'-diaminodiphenylether 20.0 | (0.1) | PMDA 21.8 (0.1) | 125.4 (529) |

TABLE 2

Properties of Polyamic Acid and Polyimide

| | Viscosity | | | Copper foil and thickness (μm) | Film thickness (μm) | Peel strength (kg/cm) | | |
|---|---|---|---|---|---|---|---|---|
| No. | inherent (dl/g) | rotational (cps) | melt (poise) (°C.) | | | room 25° C. | solder 260° C. 180 sec | solder 300° C. 180 sec |
| Example - 5 | 1.0 | 34,000 | 5,200 (340) | electrolytic (35) | 30 | 2.6 | 2.6 | 2.6 |
| Example - 6 | 1.2 | 67,000 | | " | 32 | 2.7 | 2.7 | 2.6 |
| Example - 7 | 1.1 | 48,500 | | " | 33 | 2.9 | 2.9 | 2.9 |
| Example - 8 | 0.6 | 2,000 | | " | 30 | 2.9 | 2.9 | 2.9 |
| Example - 9 | 0.60 | 2,100 | 4,700 (400) | " | 35 | 3.0 | 3.0 | 3.0 |
| Example - 10 | 1.62 | 10,000 | | " | 34 | 2.8 | 2.8 | 2.8 |

TABLE 2-continued

| | Properties of Polyamic Acid and Polyimide | | | | | | | |
|---|---|---|---|---|---|---|---|---|
| | Viscosity | | | Copper foil and thickness (μm) | Film thickness (μm) | Peel strength (kg/cm) | | |
| No. | inherent (dl/g) | rotational (cps) | melt (poise) (°C.) | | | room 25° C. | solder 260° C. 180 sec | solder 300° C. 180 sec |
| Example - 11 | 1.70 | 8,500 | | " | 35 | 2.9 | 2.7 | 2.7 |
| Example - 12 | 1.8 | 12,000 | | " | 37 | 2.8 | 2.8 | 2.8 |
| Example - 13 | 0.85 | 8,000 | | rolled (35) | 30 | 2.4 | 2.4 | 2.4 |
| Example - 14 | 0.85 | 8,000 | | electrolytic (35) | 30 | 2.9 | 2.9 | 2.9 |
| Example - 15 | 0.78 | 5,000 | 4,800 (360) | electrolytic (35) | 35 | 2.8 | 2.8 | 2.8 |
| Example - 16 | 0.8 | 5,800 | | " | 30 | 2.8 | 2.8 | 2.8 |
| Example - 17 | 1.6 | 5,000 | | " | 30 | 2.2 | 2.2 | 2.2 |
| Example - 18 | 0.62 | 8,500 | | " | 28 | 2.7 | 2.7 | 2.7 |
| Example - 19 | 0.55 | 1,400 | 3,500 (400) | " | 80 | 2.7 | 2.7 | 2.7 |
| Example - 20 | 1.1 | 25,000 | | " | 35 | 2.8 | 2.8 | 2.8 |
| Example - 21 | 0.68 | 3,800 | | " | 35 | 2.8 | 2.8 | 2.8 |
| Comparat. Example - 2 | 1.5 | 9,000 | | " | 30 | 0.5 | 0.5 | 0.5 |

We claim:

1. A flexible copper-clad circuit substrate comprising a high-temperature flowable polyimide film directly jointed with copper foil in the absence of adhesive therein between, the polyimide having recurring units of the formula:

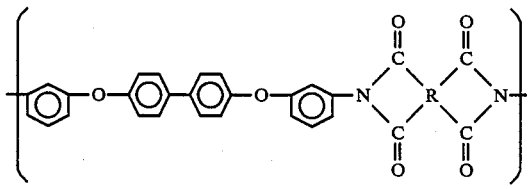

wherein R is a tetra-valent radical selected from the group consisting of a aliphatic radical having 2 and more carbons, a cycloaliphatic radical, monoaromatic radical, a fused polycyclic radical and a polycyclic aromatic radical wherein the aromatic radicals are linked to one another directly or via a bridge member.

2. A flexible copper-clad circuit substrate comprising a high-temperature flowable polyimide film directly jointed with a copper foil in the absence of an adhesive, the polyimide has the recurring units of the general formula:

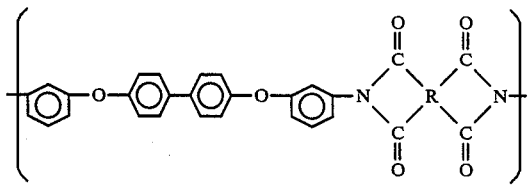

wherein R is a tetra-valent radical selected from the group consisting of an aliphatic radical having 2 or more carbons, a cycloaliphatic radical, monoaromatic radical, a fused polycyclic radical and a polycyclic aromatic radical wherein the aromatic radicals are linked to one another directly or via a bridge member, said flexible copper-clad circuit substrate having been prepared by the process comprising placing a film or powder of said polyimide on said copper foil, pressing said polyimide foil or powder at 50° to 400° C. under a pressure of 1 to 1,000 kg/cm² and curing said pressed polyimide film at 100° to 400° C.

3. A flexible copper-clad substrate comprising a high-temperature flowable polyimide film directly jointed with a copper foil in the absence of an adhesive, the polyimide has the recurring units of the general formula:

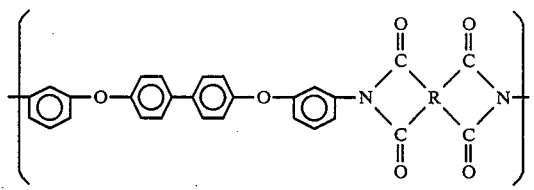

wherein R is a tetra-valent radical selected from the group consisting of an aliphatic radical having 2 or more carbons, a cycloaliphatic radical, monoaromatic radical, a fused polycyclic radical and a polycyclic aromatic radical wherein the aromatic radicals are linked to one another directly or via a bridge member, said flexible copper-clad circuit substrate having been prepared by the process comprising placing a solution of polyamic acid onto the copper foil, the polyamic acid solution having a viscosity of 1,000 to 300,000 centipoises, and heating the copper foil and the layer of said polyamic acid solution at 100° to 400° C., whereby the solvent is removed and said polyamic acid is converted said polyimide.

* * * * *